(12) United States Patent
Butcher et al.

(10) Patent No.: US 10,660,197 B2
(45) Date of Patent: May 19, 2020

(54) DIFFERENTIAL PAIR GROUP EQUALIZATION SYSTEM

(71) Applicant: Dell Products L.P., Round Rock, TX (US)

(72) Inventors: Wade Andrew Butcher, Cedar Park, TX (US); Bhyrav M. Mutnury, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 118 days.

(21) Appl. No.: 16/041,315

(22) Filed: Jul. 20, 2018

(65) Prior Publication Data

US 2020/0029425 A1    Jan. 23, 2020

(51) Int. Cl.
*H04B 3/14* (2006.01)
*H05K 1/02* (2006.01)
*H04B 1/40* (2015.01)

(52) U.S. Cl.
CPC ............. *H05K 1/0245* (2013.01); *H04B 1/40* (2013.01); *H04B 3/14* (2013.01); *H04B 3/148* (2013.01); *H05K 1/0228* (2013.01); *H05K 2201/09236* (2013.01); *H05K 2201/10189* (2013.01)

(58) Field of Classification Search
CPC ....... H05K 1/0228; H05K 2201/09236; H04B 3/148; H04B 3/14; H04B 3/145; H04B 3/143; H04B 3/146; H04B 3/147; H04B 3/04

USPC ............ 333/28 R, 5; 375/229, 230, 232, 233
See application file for complete search history.

(56) References Cited

U.S. PATENT DOCUMENTS

| 5,003,308 A | 3/1991 | Furniss et al. |
|---|---|---|
| 8,923,371 B2 | 12/2014 | Sindalovsky et al. |
| 9,231,752 B1 | 1/2016 | Yan et al. |
| 2005/0212564 A1* | 9/2005 | Gabillard ............. G11C 27/026 327/94 |

\* cited by examiner

*Primary Examiner* — Stephen E. Jones
(74) *Attorney, Agent, or Firm* — Haynes and Boone, LLP (57) ABSTRACT

A differential pair group equalization system includes a board providing a differential trace pair group with a plurality of differential trace pairs, each of a transmitter device and a receiver device are coupled to the board and the differential trace pairs in the differential trace pair group. At least one of the transmitter device and the receiver device operates to identify a first differential trace pair in the differential trace pair group, and adjust second differential trace pair equalization parameters for a second differential trace pair in the differential trace pair group. If it is determined that first differential trace pair signal transmission capabilities for the first differential trace pair have improved in response to the adjustment of the second differential trace pair equalization parameters for the second differential trace pair the second differential trace pair equalization parameters are set for the second differential trace pair.

20 Claims, 9 Drawing Sheets

FIG. 7

DIFFERENTIAL PAIR GROUP EQUALIZATION SYSTEM

DIFFERENTIAL PAIR GROUP EQUALIZATION SYSTEM BACKGROUND

The present disclosure relates generally to information handling systems, and more particularly to the equalization of signals transmitted by differential pairs in differential pairs groups provided in an information handling system.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems often utilize differential signaling techniques to transmit signals between devices. Differential signaling operates by sending the same electrical signal as a differential pair of complementary signals, each in its own conductor (e.g., via differential trace pairs routed on a board in the information handling system.) However, as the speed at which such differential signals are transmitted continues to increase, the performance of those the signals continues to degrade. Conventional solutions to signal degradation include mitigating board losses using mid-loss, loss-low, and ultra-low loss board materials, and/or performing equalization techniques such as pre-emphasis, de-emphasis, Continuous Time Linear Equalization (CTLE), Decision Feedback Equalization (DFE), and/or other equalization techniques on the signals at the transmitter device and/or the receiver device in order to compensate for losses. However, such conventional solutions still allow crosstalk between adjacent differential trace pairs, which can substantially degrade the quality of the signal being transmitted (e.g., as measured using an eye diagram.) Furthermore, conventional equalization techniques have been found to introduce additional crosstalk issues between signals transmitted on adjacent differential trace pairs. For example, equalization technique may provide for the dampening of low frequency signal components and the accentuation of high frequency signal components in a signal transmitted by a differential trace pair, and the accentuation of high frequency components in a signal transmitted by a particular differential trace pair has been found to have an adverse effect on signals transmitted by neighboring differential trace pairs.

Accordingly, it would be desirable to provide an improved differential pair equalization system.

SUMMARY

According to one embodiment, an Information Handling System (IHS) includes a processing system; and a memory system that is coupled to the processing system and that includes instructions that, when executed by the processing system, cause the processing system to provide an equalization engine that is configured to: identify a first differential pair that is included in a plurality of differential pairs that are coupled to the processing system; provide for the adjustment of second differential pair equalization parameters for a second differential pair that is included in the plurality of differential pairs that are coupled to the processing system; and determine that first differential pair signal transmission capabilities for the first differential pair have improved in response to the adjustment of the second differential pair equalization parameters for the second differential pair and, in response, cause the second differential pair equalization parameters to be set for the second differential pair.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
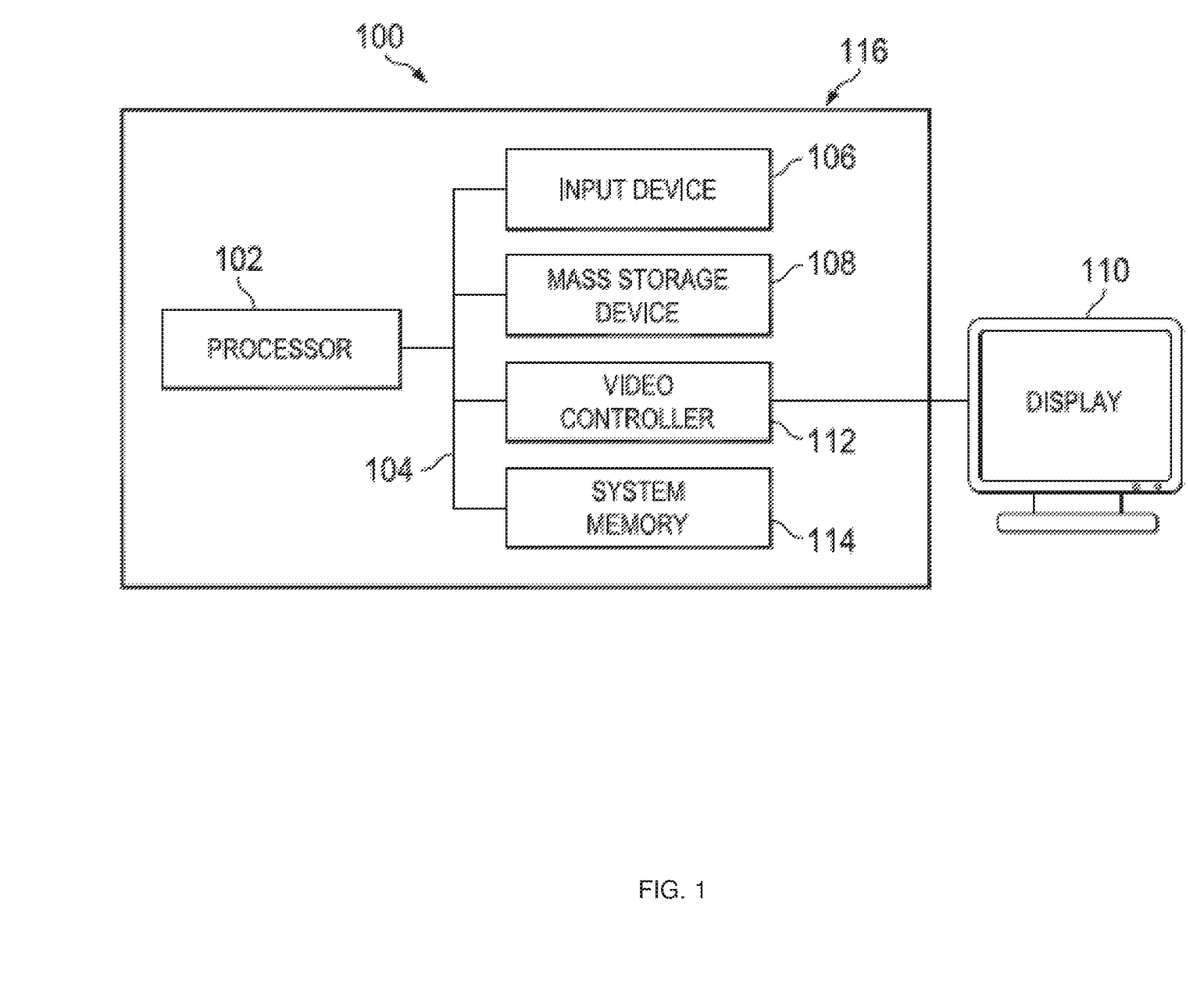
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
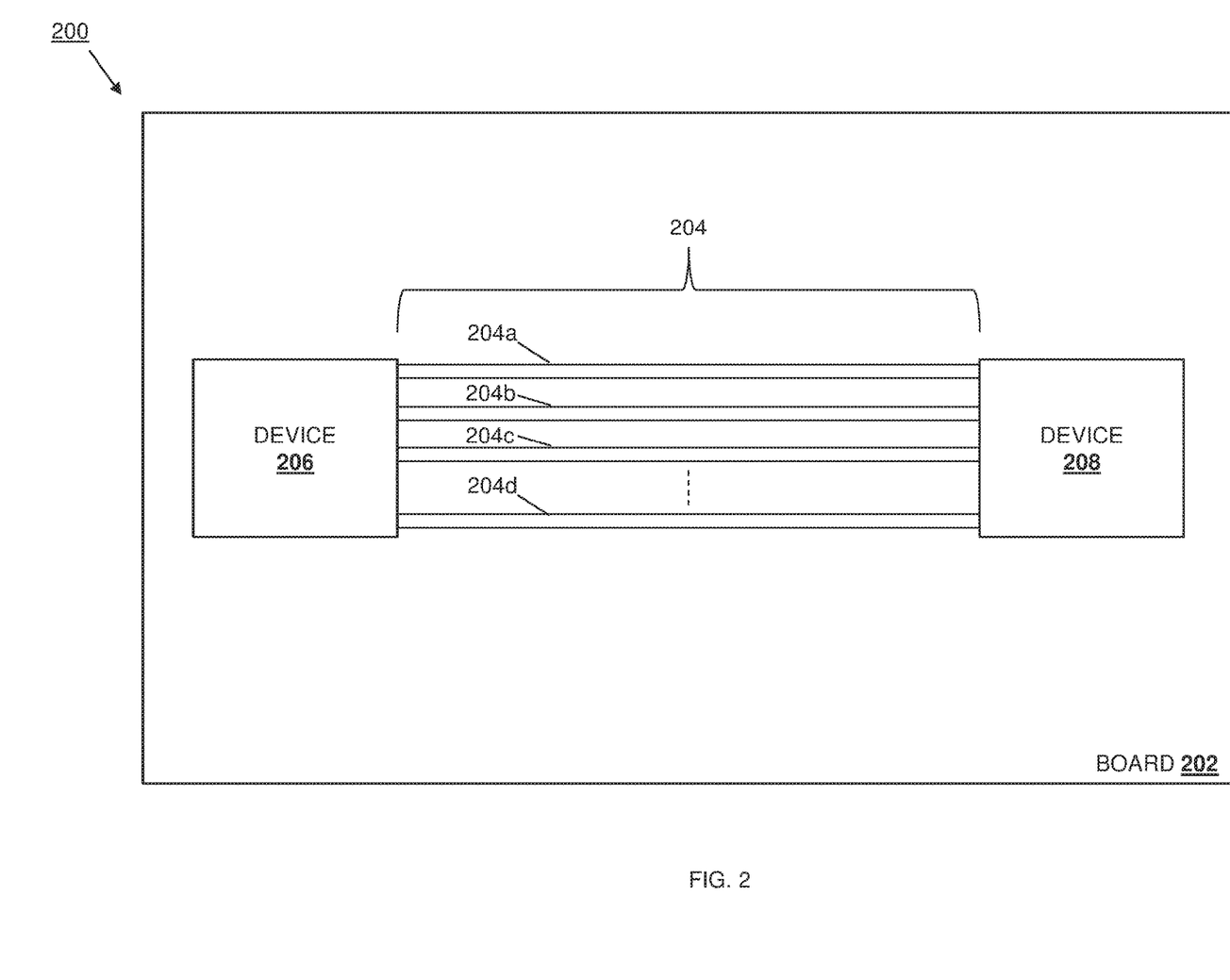
FIG. 2 is a schematic view illustrating an embodiment of a differential pair group equalization system.

Referring now to FIG. 2, an embodiment of a differential pair group equalization system 200 is illustrated. In an embodiment, the differential pair group equalization system 200 may be provided in the IHS 100 discussed above with reference to FIG. 1, and/or may include some or all of the components of the IHS 100. In the illustrated embodiment, the differential pair group equalization system 200 includes a board 202 that may be provided by, for example, a motherboard, a card, and/or any other boards that would be apparent to one of skill in the art in possession of the present disclosure. The board 202 provides a differential trace pair group 204 that includes plurality of differential trace pairs 204*a*, 204*b*, 204*c*, and up to 204*d* that are routed on and/or in the board 202 between a device 206 and a device 206. As would be understood by one of skill in the art in possession of the present disclosure, each of the differential trace pairs 204*a*-204*d* may be provided by a pair of traces that are routed through the board 202 and that are each configured to carry the same electrical signal as a differential pair of complementary signals. Furthermore, in specific example, the differential trace pair group 204 may provide a high speed serial bus/link that one of skill in the art in possession of the present disclosure will recognize typically includes multiple differential trace pairs (e.g., x4, x8, x16, x32, etc.) that provide a plurality of "lanes" that each include one differential trace pair dedicated to transmitter communications, and one differential trace pair dedicated to receiver communications However, while the illustrated embodiment includes a differential trace pair group with differential trace pairs, one of skill in the art in possession of the present disclosure will recognize that other differential pair groups having differential pairs (e.g., wired differential pairs and/or other differential pair components) configured in a variety of manners will benefit from the teachings of the present disclosure as thus fall within its scope as well.

In an embodiment, each of the devices 206 and/or 208 may be provided by one or more components in the IHS 100 discussed above with reference to FIG. 1. Furthermore, one of skill in the art in possession of the present disclosure will recognize that each of the devices 206 and 208 may operate as the receiver device and/or transmitter device discussed below. In a specific example, the device 206 may be a Central Processing Unit (CPU), and the device 208 may be a storage controller, another CPU, a network controller, an adapter card, a hard drive, and/or a variety of other computing components that would be apparent to one of skill in the art in possession of the present disclosure. However, one of skill in the art in possession of the present disclosure will recognize that any device coupled to a differential pair group will fall within the scope of the present disclosure as well. While a specific differential pair group equalization system 200 has been illustrated and described, one of skill in the art will recognize that differential pair group equalization systems may include a variety of components and/or a variety of component configurations that will fall within the scope of the present disclosure as well. For example, one of skill in the art in possession of the present disclosure will recognize that the routing of the differential trace pairs 204*a*-*d* in the differential trace pair group 204 has been greatly simplified in FIG. 2, and differential trace pairs in multiple different differential trace pair groups may (and typically will) be routed using much more complicated routing paths, and on multiple different levels of the board 202, while still benefitting from the teachings of the present disclosure.

Figure 3A:
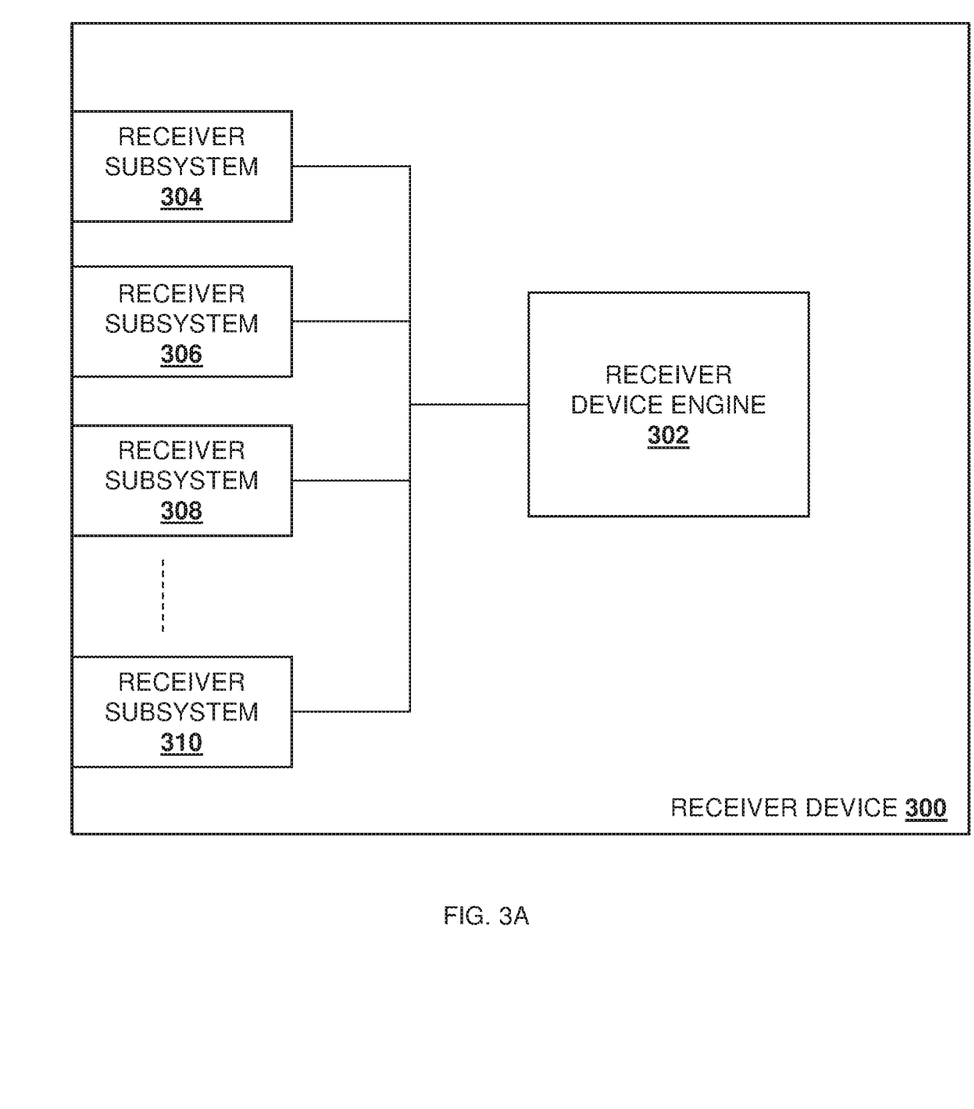
FIG. 3A is a schematic view illustrating an embodiment of a receiver device that may be provided in the differential pair group equalization system of FIG. 2.
Figure 3B:
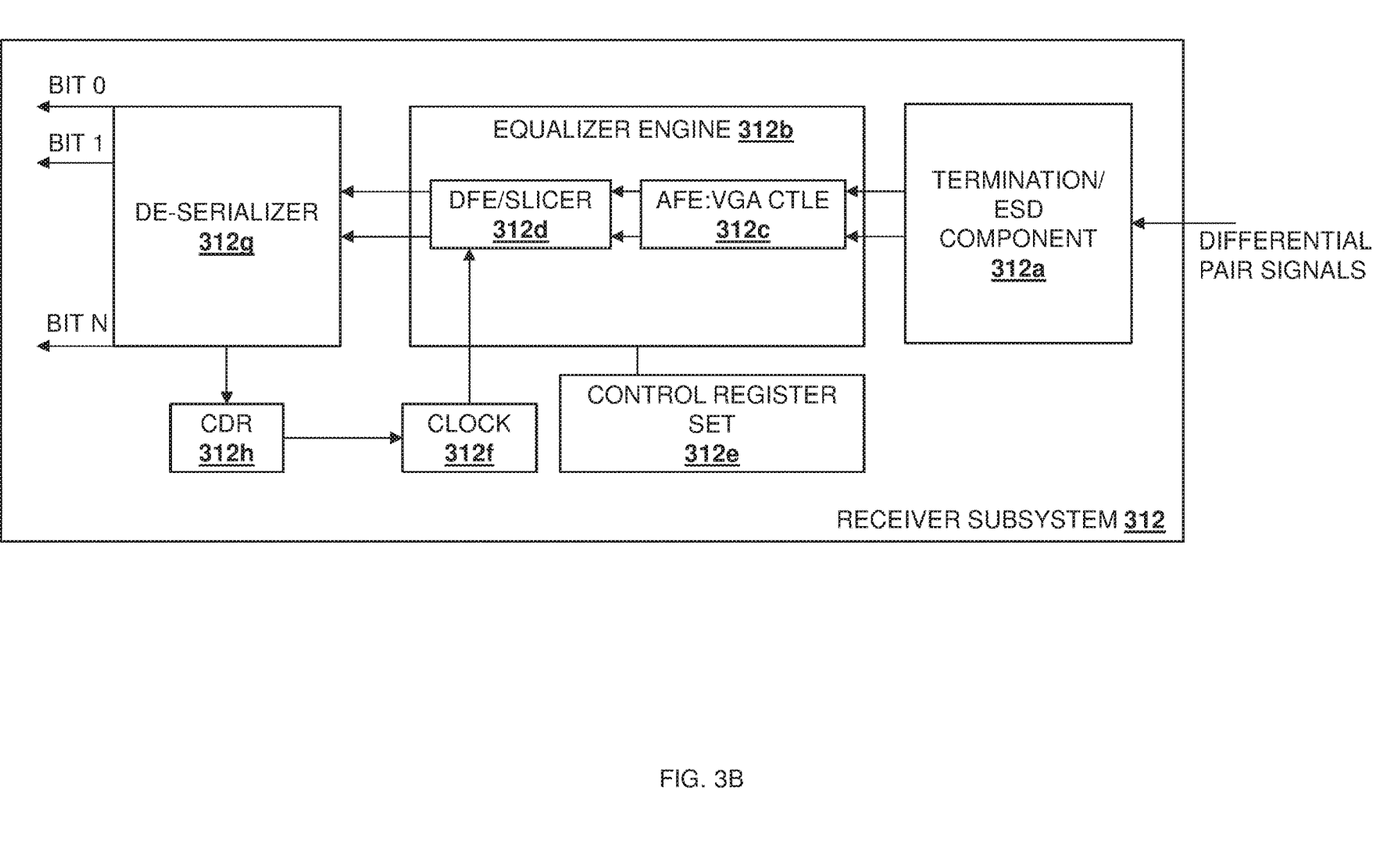
FIG. 3B is a schematic view illustrating an embodiment of a receiver subsystem that may be provided in the receiver device of FIG. 3A.

Referring now to FIGS. 3A and 3B, an embodiment of a receiver device 300 is illustrated that may be either of the devices 206 and 208 discussed above with reference to FIG. 2. As such, the receiver device 300 may be a component in the IHS 100 discussed above with reference to FIG. 1. The receiver device 300 may include a processing system (not illustrated, but which may include the processor 102 discussed above with reference to FIG. 1, or a component having similarly functionality) and a memory system (not illustrated, but which may include the memory 114 discussed above with reference to FIG. 1, or a component having similarly functionality) that includes instructions that, when executed by the processing system, cause the processing system to provide a receiver device engine 302 that is configured to perform the functionality of the receiver device engines and receiver devices discussed below.

The receiver device 300 also includes a plurality of receiver subsystems 304, 306, 308, and up to 310, each of which may be coupled to the receiver device engine 302 (e.g., via a connection between each subsystem 304-310 and the processing system that provides the receiver device engine 302), and each of which may be configured to couple the receiver device engine 302 to a respective differential par (e.g., the differential trace pairs 204*a*-*d* discussed with reference to FIG. 2) for the purposes of, for example, communicating parameter adjustment results to adjacent channels or lanes, as discussed below. In a specific example, the receiver subsystems 304, 306, 308, and 310 may each be provided by a physical layer (PHY) chip such as, for example a Serializer/Deserializer (SerDes) PHY chip, although other processor/memory subsystems will fall within the scope of the present disclosure as well.

In a specific example, each of the receiver subsystems 304, 306, 308, and 310 of FIG. 3A by be provided by the receiver subsystem 312 illustrated in FIG. 3B. As can be seen in FIG. 3B, the receiver subsystem 312 may include a termination/ElectroStatic Discharge (ESD) component 312*a* that is configured to receive differential pair signals from the differential pair connected to the receiver subsystem 312. An equalizer engine 312*b* is coupled to the termination/ESD component 312*a*, and may include an Analog Front End (AFE): Variable Gain Analyzer (VGA) Continuous Time Linear Equalizer (CTLE) 312*c* that is configured to receive signals from the termination/ESD component 312*a*, along with a Decision Feedback Equalization (DFE)/Slicer 312*d* that is configured to receive signals from the AFE: VGA CTLE 312*c*. The equalizer engine 312*b* is also coupled to a control register set 312*e* that are configured to store the equalization parameters discussed below, as well as to a clock 312*f* that is configured to provide clock signals to the DFE/slicer 312*d*. A de-serializer 312*g* is configured to receive signals from the DFE/slicer 312*d*, and provide signals to a Clock and Data Recovery (CRD) 312*h*. While a specific receiver device 300 and receiver subsystem 312 have been illustrated and described, one of skill in the art in possession of the present disclosure will recognize that receiver devices and receiver subsystems may include a variety of components and/or component configuration for providing conventional receiver device and receiver subsystem functionality, as well as the functionality discussed below, while remaining within the scope of the present disclosure.

Figure 4A:
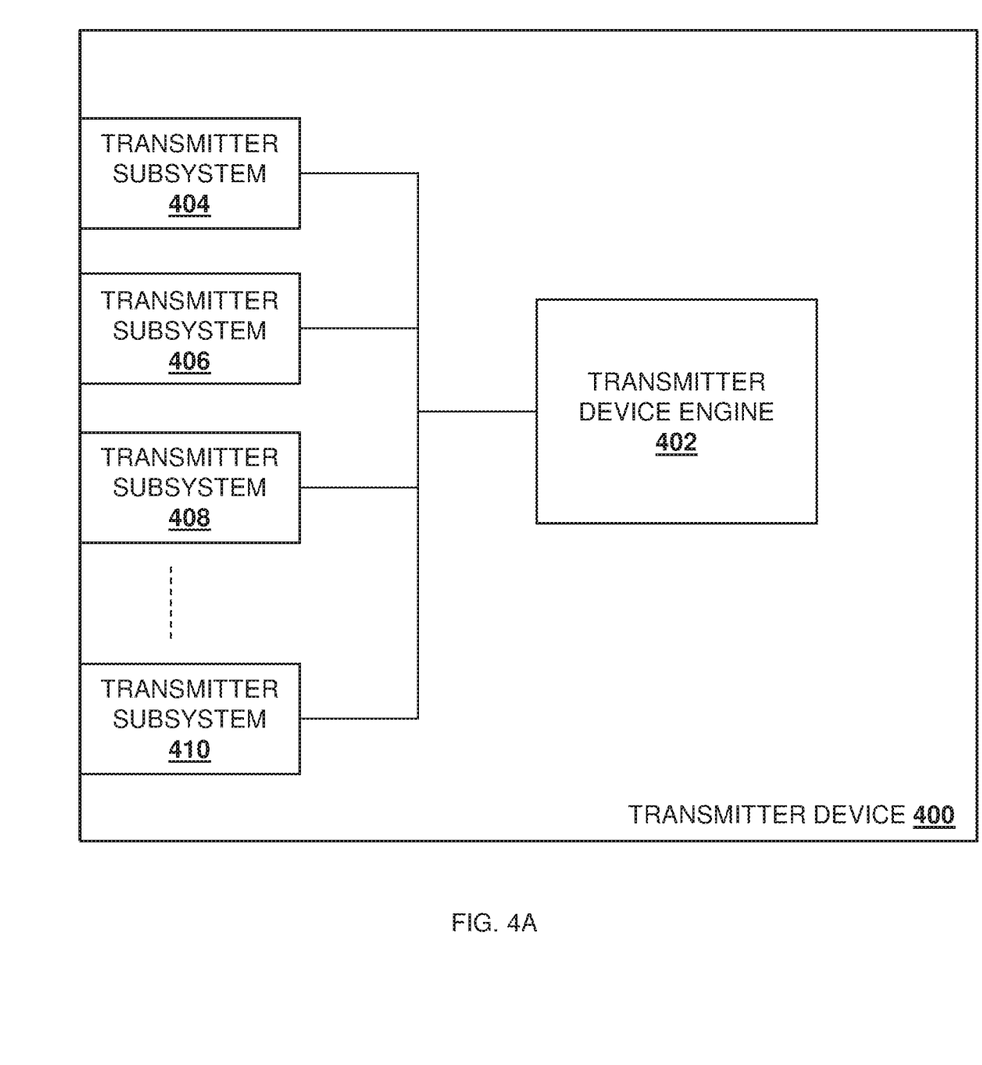
FIG. 4A is a schematic view illustrating an embodiment of a transmitter device that may be provided in the differential pair group equalization system of FIG. 2.
Figure 4B:
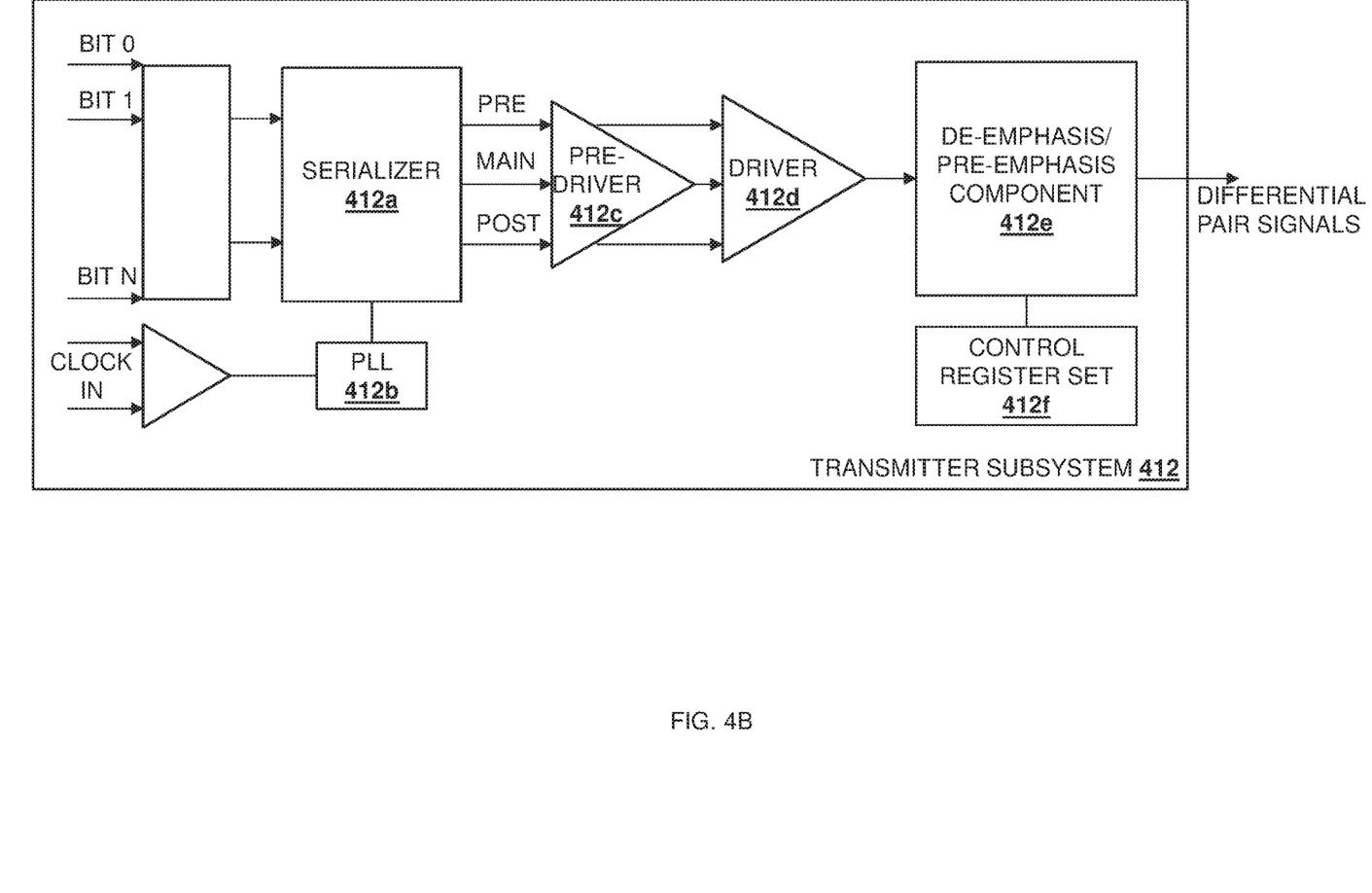
FIG. 4B is a schematic view illustrating an embodiment of a transmitter subsystem that may be provided in the transmitter device of FIG. 4A.

Referring now to FIGS. 4A and 4B, an embodiment of a transmitter device 400 is illustrated that may be either of the devices 206 and 208 discussed above with reference to FIG. 2. As such, the transmitter device 400 may be a component in the IHS 100 discussed above with reference to FIG. 1. The transmitter device 400 may include a processing system (not illustrated, but which may include the processor 102 discussed above with reference to FIG. 1, or a component having similarly functionality) and a memory system (not illustrated, but which may include the memory 114 discussed above with reference to FIG. 1, or a component having similarly functionality) that includes instructions that, when executed by the processing system, cause the processing system to provide a transmitter device engine 402 that is configured to perform the functionality of the transmitter device engines and transmitter devices discussed below.

The transmitter device 400 also includes a plurality of transmitter subsystems 404, 406, 408, and up to 410, each of which may be coupled to the transmitter device engine 402 (e.g., via a connection between each subsystem 404-410 and the processing system that provides the transmitter device engine 402), and each of which may be configured to couple the transmitter device engine 402 to a respective differential par (e.g., the differential trace pairs 204*a-d* discussed with reference to FIG. 2.) In a specific example, the transmitter subsystems 404, 406, 408, and 410 may be provided by a physical layer (PHY) chip such as, for example a Serializer/Deserializer (SerDes) PHY chip, although other processor/memory subsystems will fall within the scope of the present disclosure as well.

In a specific example, each of the transmitter subsystems 404, 406, 408, and 410 of FIG. 4A by be provided by the transmitter subsystem 412 illustrated in FIG. 4B. As can be seen in FIG. 4B, the transmitter subsystem 412 may include a serializer 412*a* that is configured to receive signals from a Phase Locked Loop (PLL) 412*b*. A pre-driver 412*c* is configured to receive signals from the serializer 412*a*, and a provide signals (e.g., PRE, MAIN, and POST signals in the illustrated embodiment) to a driver 412*d*. A de-emphasis/pre-emphasis component 412*e* is configured to receive signals from the driver 412*d*, provide signals to the differential trace pair connected to the transmitter subsystem, and is coupled to a control register set 412*f* that are configured to store the equalization parameters discussed below. While a specific transmitter device 400 and transmitter subsystem has been illustrated and described, one of skill in the art in possession of the present disclosure will recognize that transmitter devices and transmitter subsystems may include a variety of components and/or component configuration for providing conventional transmitter device and transmitter subsystem functionality, as well as the functionality discussed below, while remaining within the scope of the present disclosure. Furthermore, the receiver device 300 and transmitter device 400 have been illustrated and described separately for purposes of the discussion below, but one of skill in the art in possession of the present disclosure will recognize that the devices 206 and 208 may include the functionality of both of the receiver device 300 and the transmitter device 400, and may operate as receiver devices and/or transmitter devices in different situations.

Figure 5:
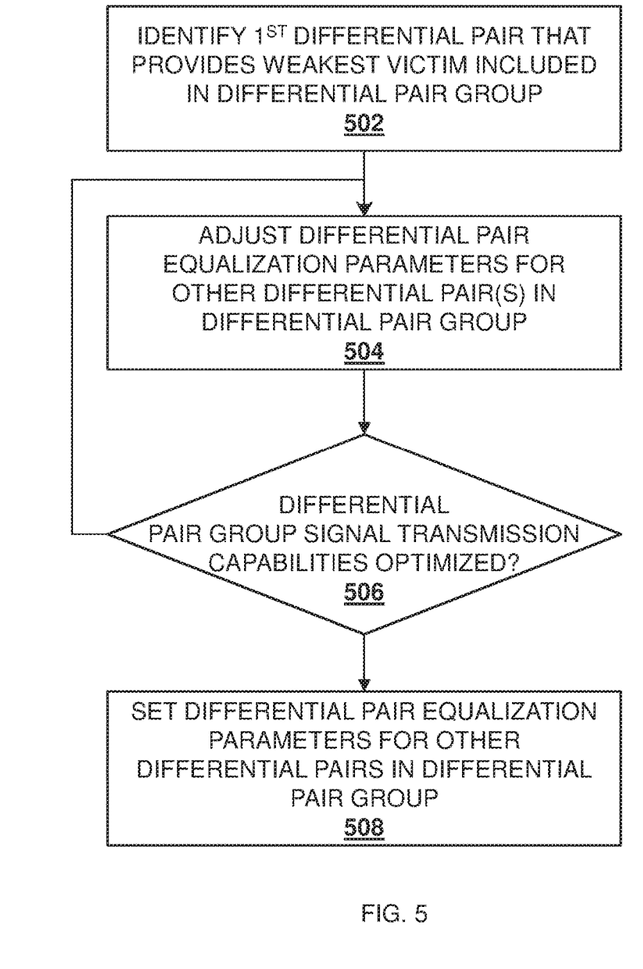
FIG. 5 is a flow chart illustrating an embodiment of a method for providing equalization for a differential pair group.

Referring now to FIG. 5, an embodiment of a method for providing differential pair group equalization is illustrated. As discussed below, the systems and methods of the present disclosure provides for the minimization of crosstalk between differential pairs in a differential pair group by providing for equalization of differential pair(s) in the differential pair group that takes into account how the equalization of any particular differential pair effects proximate differential pair(s). For example, the differential pair(s) that are determined after link training operations to have the weakest signal transmission capabilities relative to other differential pairs in the differential pair group may have their proximate differential pair(s) equalized so that their signal transmission capabilities are increased. In a specific example, the equalization of proximate differential pairs to improve the relatively weak signal transmission capabilities of any particular differential pair(s) may be performed until an eye opening in an eye opening diagram for the differential pair group is optimized, which provides a differential pair group with equalized signals and minimized crosstalk between differential pairs in that differential pair group. Experimental embodiments utilizing such techniques have found 25%-50% increases of eye openings in eye diagrams for differential pair groups.

The method 500 begins at block 502 where a first differential pair that provides a weakest victim included in a differential pair group is identified. In an embodiment, at or prior to block 502, either or both of the devices 206 and 208 (e.g., a receiver device 300 and/or a transmitter device 400) may operate to identify a differential pair group. For example, the receiver device engine 302 and/or the receiver subsystems 304-310 in the receiver device 300 and/or the transmitter device engine 402 and/or the transmitter subsystems 304-310 in the transmitter device 400 may operate to identify serial lanes (e.g., each including a transmitter differential pair and a receiver differential pair) in a bus/link (e.g., a x16 bus/link that provides 16 differential pairs numbered "0" through "15") that provides the differential pair group. With reference to FIG. 2, the differential trace pairs 204*a-d* in the differential trace pair group 204 may be identified. Following identification of the differential pair group, auto-negotiation may be performed between the devices 206 and 208 by, for example, sharing capabilities regarding transmission parameters, and selecting the highest performance transmission mode supported by both of the devices 206 and 208 to define common transmission parameters for use in signaling such as, for example, speed, duplex mode, flow control, and/or other transmission parameters that would be apparent to one of skill in the art in possession of the present disclosure. Following the performance of auto-negotiation, the devices 206 and 208 may perform training operations in which the devices 206 and 208 (e.g., a receiver device 300 and/or a transmitter device 400 as discussed above) communicate on the differential trace pairs 204a-d to determine ("tune") equalization settings for each of those differential trace pairs by, for example, automatically tuning the Finite Impulse Response (FIR) filter to achieve a desired bit error rate for each differential pair, and/or performing other conventional training/equalization operations that would be apparent to one of skill in the art in possession of the present disclosure.

As will be appreciated by one of skill in the art, the training operations performed on each of the differential pairs discussed above may provide for the identification of differential pair signal transmission capabilities for each of those differential pairs. As such, with reference to FIG. 2, the training operations may determine differential trace pair signal transmission capabilities for each of the differential trace pairs 204a-204d. At block 502, either of the devices 206 and 208 (e.g., operating as the receiver device 300) may operate to identify at least one differential pair in the differential pair group based on, for example, the differential pair signal transmission capabilities of that differential pair that were determined via the training operations discussed above. For example, with reference to FIG. 2, the receiver device engine 302 and/or the receiver subsystems 304-310 in the receiver device 300 may operate to identify the differential trace pair 204b in the differential trace pair group 204 based on the differential trace pair signal transmission capabilities of that differential trace pair 204b being lower than the differential trace pair signal transmission capabilities of the differential trace pairs 204a, 204c, and 204d.

As discussed above, the conventional equalization performed individually for each differential pair in the differential pair group during training operations may introduce crosstalk in one or more of the differential pairs (e.g., via signals transmitted by proximate differential pairs), thus reducing the differential pair signal transmission capabilities of those differential pairs. For example, conventional equalization techniques may provide each differential pair with a unique signal de-emphasis (discussed further below) and/or other receiver equalization, which can result in the weakest "victim" differential pairs in the differential pair group being more sensitive to equalization crosstalk from signals transmitted by neighboring "aggressor" differential pairs in the differential pair group. Furthermore, in a specific example, a differential trace pair group may include some differential pairs that are shorter than the other differential pairs (e.g., due to routing issues). That difference in length can result in a subset of the differential pairs in the differential pair group being "weaker" than the other differential pairs in that differential pair group, and thus more like to provide for the failure of signals transmitted via any of that subset of differential pairs, particularly in when crosstalk is introduce via signals transmitted by neighboring differential pairs.

In a specific example, the differential trace pair signal transmission capabilities of the differential trace pair 204b may indicate that the differential trace pair 204b has failed, that the differential trace pair 204b has a relatively high probability of failure (e.g., a higher failure probability than the rest of the differential trace pairs 204a, 204c, and 204d; a failure probability that is higher than a predetermined threshold, etc.), and/or a variety of other "weak differential trace pair" characteristics that would be apparent to one of skill in the art in possession of the present disclosure. In particular, the conventional equalization performed individually for each differential trace pair 204a and 204c in the differential trace pair group 204 during training operations may cause the differential trace pairs 204a and 204c to act as "aggressor" differential pairs that introduce crosstalk in the "victim" differential trace pair 204b, thus reducing the differential trace pair signal transmission capabilities of that differential trace pair 204b, and causing that differential trace pair 204b to be identified at block 502. While a few examples have been provided, one of skill in the art in possession of the present disclosure will recognize that a differential pair in a differential pair group may be determined to be a "victim"/relatively "weaker" than other differential pairs (i.e., "aggressors") in that differential pair group in a variety of manners that will fall within the scope of the present disclosure as well. Furthermore, while a single "weak" differential trace pair is discussed in the examples, one of skill in the art in possession of the present disclosure will recognize that any number of "weak" differential trace pairs may be identified at block 502 while remaining within the scope of the present disclosure.

The method 500 then proceeds to block 504 where differential pair equalization parameters for other differential pairs in the differential pair group are adjusted. In an embodiment, at block 504, the receiver device engine 302 and/or the receivers subsystems 304-310 in the receiver device 300 may utilize a variety of techniques to identify "aggressor" differential pairs in the differential pair group for which differential pair equalization parameters may be adjusted to reduce crosstalk in the "victim" differential pair(s) that were identified in block 502. For example, at block 504, the receiver device engine 302 and/or the receivers subsystems 304-310 in the receiver device 300 may operate to identify differential pairs in the differential pair group that are proximate the differential pair that was identified in block 502, as well as other characteristics that would be apparent to one of skill in the art in possession of the present disclosure. With reference to FIG. 2, at block 504 the receiver device engine 302 and/or the receivers subsystems 304-310 in the receiver device 300 may identify the "aggressor" differential trace pairs 204a and 204c based on their proximity to the "victim" differential trace pair 204b.

Figure 6:
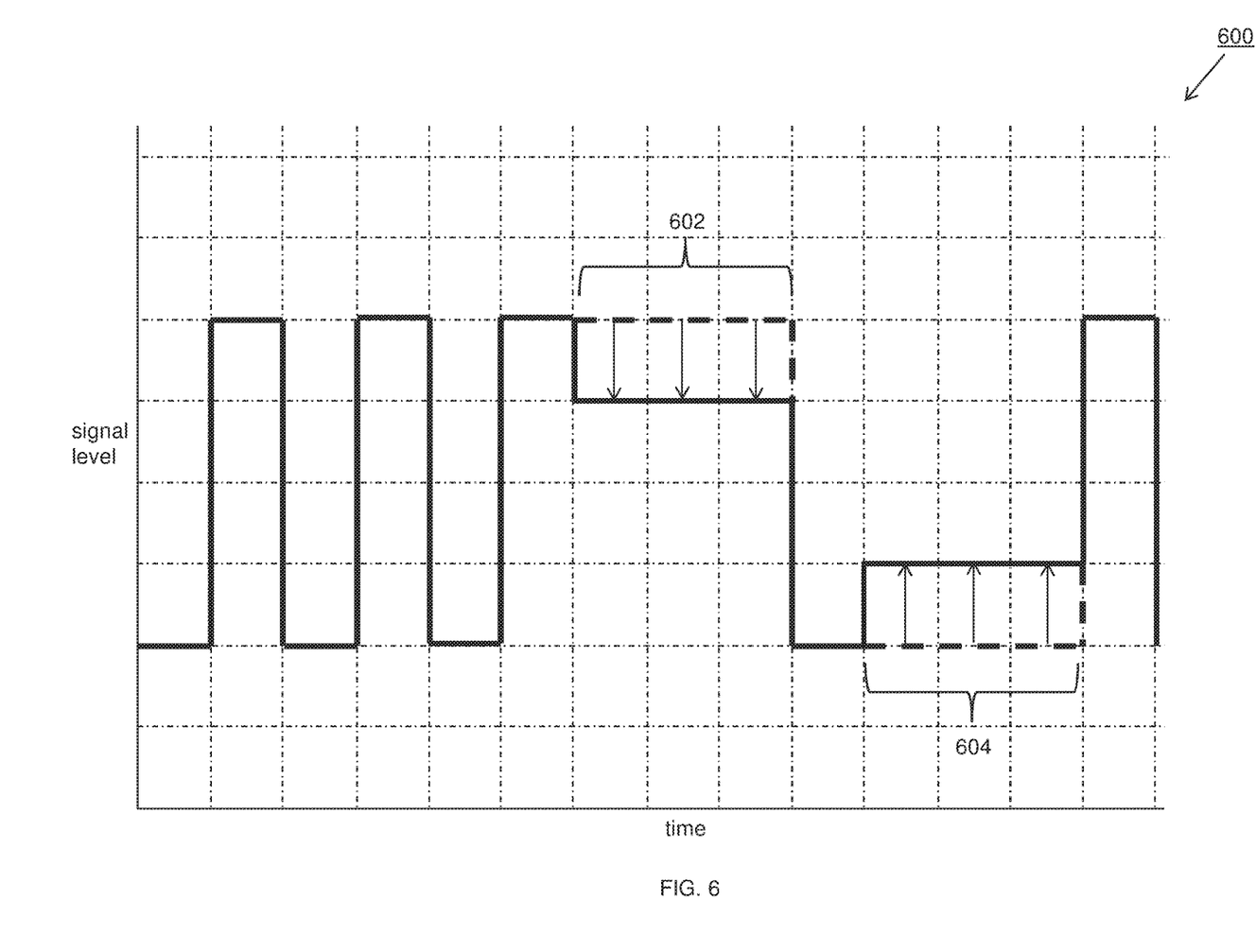
FIG. 6 is a signal diagram illustrating an embodiment of a signal de-emphasis equalization technique that may be utilized in the method of FIG. 5.
Figure 7:
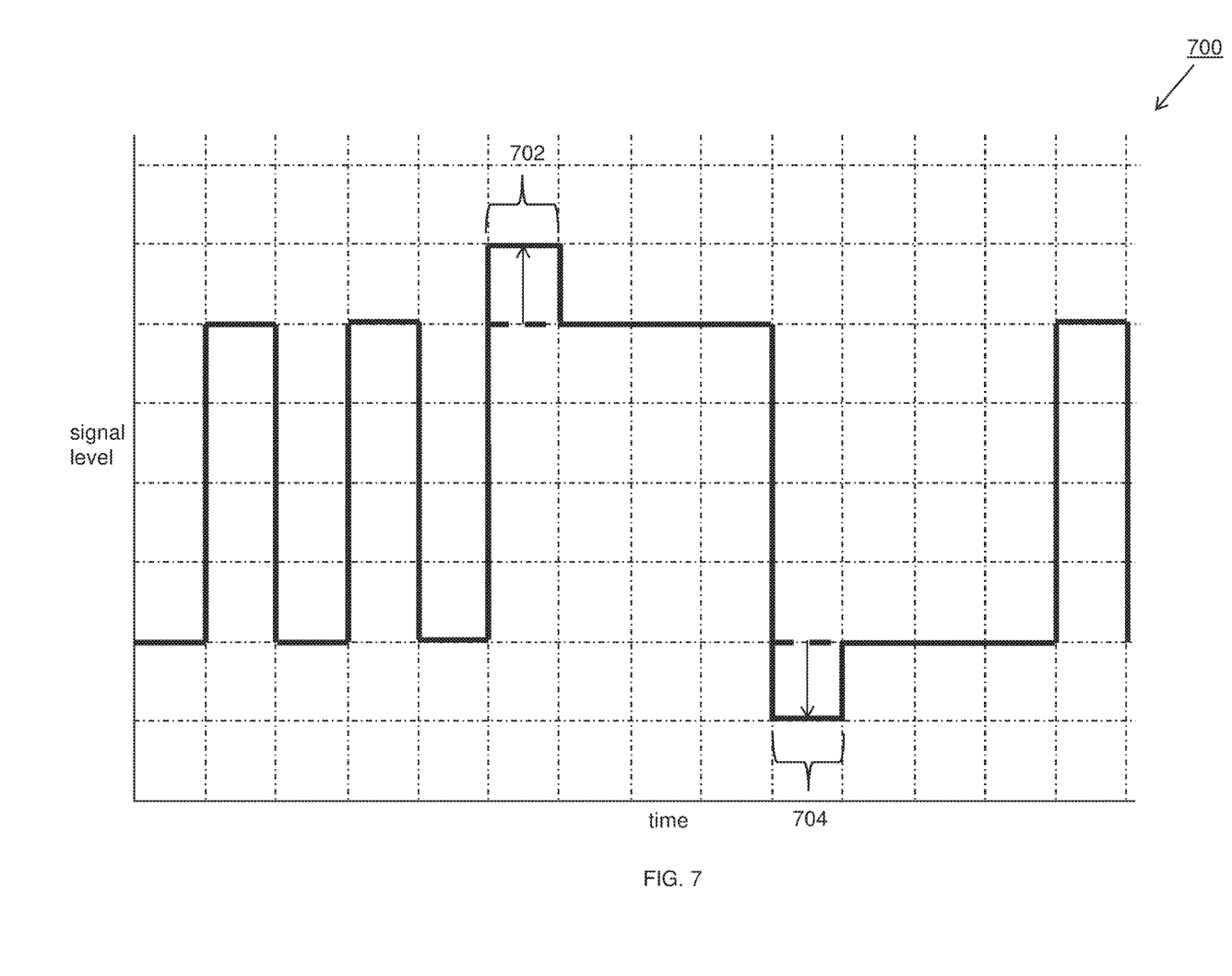
FIG. 7 is a signal diagram illustrating an embodiment of a signal emphasis equalization technique that may be utilized in the method of FIG. 5.

In addition, at block 504, the receiver device engine 302 and/or the receivers subsystems 304-310 in the receiver device 300 may then operate to adjust differential pair equalization parameters for the differential pairs in the differential pair group that were identified at block 504. For example, at block 504 the receiver device engine 302 and/or the receivers subsystems 304-310 in the receiver device 300 may adjust differential trace pair equalization parameters the differential trace pairs 204a and 204c. With reference to FIGS. 6 and 7, embodiments of signal diagrams 600 and 700 are illustrated that provide example of signals that may be produced by a differential pair based on the adjustment of differential pair equalization parameters at block 504. In a specific example, the adjustment of the differential trace pair equalization parameters for the differential trace pairs 204a and/or 204c may include the receiver device engine 302 and/or the receivers subsystems 304-310 in the receiver device 300 adjusting (and/or providing for the adjustment of) differential trace pair equalization parameters in the equalization parameter registers of the couplings that are coupled to the differential trace pair 204a and/or 204c. With reference to FIGS. 2, 3, and 4, differential trace pair equalization parameters in the control register sets 312e and 412f in the receiver subsystem 312 and transmitter subsystem 412, respectively, may be adjusted at block 504. In a specific example, de-emphasis and/or pre-emphasis in the transmitter subsystem 412 may be adjusted, while CTLE, DFE, boost, gain, and/or other parameters in the receiver subsystem 312 may be adjusted.

As illustrated in FIG. 6, the differential trace pair equalization parameters adjustments may provide for de-emphasis of the signal (e.g., as illustrated by portions 602 and 604 of the signal that are de-emphasized from an original level (indicated by the dashed lines in FIG. 6) to an adjusted level (indicated by the arrows and solid lines in FIG. 6.)) As also illustrated in FIG. 7, the differential trace pair equalization parameters adjustments may provide for emphasis of the signal (e.g., as illustrated by portions 702 and 704 of the signal that are emphasized from an original level (indicated by the dashed lines in FIG. 7) to an adjusted level (indicated by the arrows and solid lines in FIG. 7.) One of skill in the art in possession of the present disclosure will recognize that the signal de-emphasis illustrated in the signal diagrams 600 of FIG. 6 only provides for such de-emphasis on a portion of the signals that maintain a particular signal level for more than one time period. However, this specific adjustment of the differential trace pair equalization parameters, along with the associated signal adjustment, is provided merely as an example, and one of skill in the art in possession of the present disclosure will recognize that the equalization of the differential pairs (e.g., the differential trace pairs 204a and 204c) at block 504 may be performed in a variety of manners while remaining within the scope of the present disclosure as well.

With reference to the de-emphasis of the signal illustrated in the signal diagram of FIG. 6, one of skill in the art in possession of the present disclosure will recognize that signal de-emphasis techniques are associated with high speed switching that transitions the signal level from a "high" level to a "de-emphasized level", and that transition can conventionally induce both capacitive and inductive crosstalk. Furthermore, the higher the intensity of the equalization, the larger the crosstalk effect will be, and when all the signals in a differential pair group are switched simultaneously in such a manner, relatively high levels of crosstalk are introduced that can limit timing and increase jitter. However, when the signals are provided out of phase, the crosstalk impact will change, with its effect on timing being reduced and its effect on signal attenuation increased. For example, when signals are provided with different levels of transmitter equalization, a subsequent simultaneous switching by devices will not create large amounts of crosstalk at a given frequency, and rather will space the impact of the crosstalk over a range of frequencies, thus minimizing the overall impact induced in the victim differential par.

The method 500 then proceeds to decision block 506 where it is determined whether differential pair group signal transmission capabilities have been optimized. In an embodiment, at decision block 506, the receiver device engine 302 and/or the receiver subsystems 304-310 in the receiver device 300 may operate to determine whether the differential pair group signal transmission capabilities for the differential pair group have been optimized. For example, with reference to FIGS. 2 and 3, at decision block 506 the receiver device engine 302 and/or the receiver subsystems 304-310 in the receiver device 300 may determine whether differential trace pair group signal transmission capabilities for the differential trace pair group 204 have been optimized. In a specific example, at decision block 506, the receiver device engine 302 and/or the receiver subsystems 304-310 in the receiver device 300 may determine whether an eye opening in an eye opening diagram for the differential trace pair group 204 has increased in response to the adjustments of the differential trace pair equalization parameters for the differential trace pairs 204a and 204c at block 504. However, one of skill in the art in possession of the present disclosure will recognize that other techniques may be utilized to determine whether differential pair group signal transmission capabilities for a differential pair group have been optimized while remaining within the scope of the present disclosure as well. In another example, the receiver device engine 302 and/or the receiver subsystems 304-310 in the receiver device 300 may determine whether differential pair signal transmission capabilities for the differential pair identified at block 502 have increased. With reference to FIGS. 2 and 3 and the example provided above, the receiver device engine 302 and/or the receiver subsystems 304-310 in the receiver device 300 may determine whether differential trace pair signal transmission capabilities for the differential trace pair 204b have increased.

If, at decision block 506, it is determined that differential pair group signal transmission capabilities have not been optimized, the method 500 returns to block 504 to adjust the differential pair equalization parameters for the other differential pairs in the differential pair group, and then to decision block 506 to determine whether differential pair group signal transmission capabilities have been optimized. As such, the method 500 may loop through blocks 504 and 506 until the differential pair group signal transmission capabilities of the differential pair group have been optimized. For example, the loop provided by blocks 504 and 506 may include continued adjustments of the differential pair equalization parameters for differential pairs (e.g., providing for the varying of equalization in 0.1 dB increments), each followed by the determination of whether the differential pair group signal transmission capabilities have increased. As will be appreciated by one of skill in the art in possession of the present disclosure, training operations performed according to each loop of blocks 504 and 506 typically take on the order of microseconds, so such loops may be performed for hundreds of signals in a period of microseconds.

In a specific example, the loop provided by blocks 504 and 506 may include the receiver device engine 302 and/or the receiver subsystems 304-310 in the receiver device 300 providing for the de-emphasis of signals transmitted by the differential trace pairs 204a and 204c until the eye opening in the eye diagram for the differential trace pair group 204 no longer increases, followed by the receiver device engine 302 and/or the receiver subsystems 304-310 in the receiver device 300 providing for the emphasis of signals transmitted by the differential trace pairs 204a and 204c until the eye opening in the eye diagram for the differential trace pair group 204 no longer increases. In some embodiments, all transmitter signals may either be emphasized or de-emphasized together based on the transmitter equalization scheme, with such emphasis or de-emphasis provided at a variety of levels. For example, if all the transmitter signals are being de-emphasized, different transmitter signals provided on respective differential trace pairs may be de-emphasized with different levels or intensity (e.g., one transmitter signals could be provided with a 0 dB intensity, another with a 1 dB intensity, another with a 2 dB intensity, and so on. While a few examples have been provided, one of skill in the art in possession of the present disclosure will recognize that blocks 504 and 506 may be performed in a variety of manners that will adjust the equalization of the differential trace pairs 204a and 204c to reduce crosstalk introduced in the differential trace pair 204b, thus increasing the differential trace pair signal transmission capabilities of the differential trace pair 204b and the differential trace pair group 204, while remaining within the scope of the present disclosure.

If, at decision block 506, it is determined that differential pair group signal transmission capabilities have been optimized, the method 500 proceeds to block 508 where the differential pair equalization parameters for the other differential pairs in the differential pair group are set. In an embodiment, at block 508, the receiver device engine 302 in the receiver device 300 may set the differential pair equalization parameters (determined during the loop(s) provided by blocks 504 and 506) in the equalization parameter registers for each coupling connected to a respective differential pair that was equalized at blocks 504 and 506. As such, and with reference to the example described above for FIG. 2, the differential trace pair equalization parameters may be locked for each differential trace pair 204a-d in the differential trace pair group 204. Furthermore, one of skill in the art in possession of the present disclosure will recognize that the blocks of the method 500 may be performed for multiple differential pair groups, and at block 508 the differential trace pair equalization parameters determined during the loop provided by blocks 504 and 506 may be locked across the differential pair groups as well.

In some embodiments, following the setting of the differential pair equalization parameters for the differential pairs in the differential pair group, the devices 206 and 208 may operate to again perform training operations (e.g., "retrain") the differential pair group, but using the differential pair equalization parameters that were set at block 508. Conventionally, ttransmitter and receiver equalization settings may be tuned together. For example, a conventional receiver may communicate with the transmitter to change an equalization value that is desirable for the receiver and, following the change in the equalization value by the transmitter, the receiver may change its equalization so that it is optimal. However, in the systems and methods of the present disclosure, the transmitter may not change the equalization value to what was specifically requested by the receiver, but rather may also take into account how such a change would impact adjacent differential pairs. As such, one the transmitter equalization settings are locked based on the teachings of the present disclosure, the receiver may adjust its equalization settings (e.g., perform "receiver training") to ensure that the channel is properly equalized. Following block 508, the devices 206 and 208 may perform data communications via the differential pair group using each of the differential pairs in the differential pair group. For example, the devices 206 and 208 may transmit data between each other via the differential trace pairs 204a-d in the differential trace pair group 204, and one of skill in the art in possession of the present disclosure will recognize that the method 500 provides for a reduction in the crosstalk that would be have otherwise been introduced in the differential trace pair 204b, thus providing enhanced data communications via the differential trace pair group 204.

Thus, systems and methods have been described that provide for the minimization of crosstalk between differential pairs in a differential pair group by providing for equalization of differential pairs in the differential pair group that takes into account crosstalk introduced with proximate differential pairs in the differential pair group. For example, the differential pair(s) that are determined after training operations to have the weakest signal transmission capabilities relative to other differential pairs in the differential pair group may have their proximate differential pair(s) equalized so that their signal transmission capabilities are increased. In a specific example, the equalization of "aggressor" differential pairs in a differential pair group to improve the relatively weak signal transmission capabilities of proximate "victim" differential pair(s) may be performed until an eye opening in an eye opening diagram for the differential pair group is optimized, which provides a differential pair group with equalized signals and minimized crosstalk between differential pairs in that differential pair group.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A differential pair group equalization system, comprising:
   a board;
   a differential trace pair group that is provided on the board, wherein the differential trace pair group includes a plurality of differential trace pairs;
   a transmitter device that is coupled to the board and to each of the plurality of differential trace pairs in the differential trace pair group; and
   a receiver device that is coupled to the board and to each of the plurality of differential trace pairs in the differential trace pair group, wherein at least one of the transmitter device and the receiver device is configured to:
      identify a first differential trace pair that is included in the plurality of differential trace pairs in the differential trace pair group;
      adjust second differential trace pair equalization parameters for a second differential trace pair that is included in the plurality of differential trace pairs in the differential trace pair group; and
      determine that first differential trace pair signal transmission capabilities for the first differential trace pair have improved in response to the adjustment of the second differential trace pair equalization parameters for the second differential trace pair and, in response, set the second differential trace pair equalization parameters for the second differential trace pair.

2. The system of claim 1, wherein the at least one of the transmitter device and the receiver device is configured to:
   adjust third differential trace pair equalization parameters for at least one third differential trace pair that is included in the plurality of differential trace pairs in the differential trace pair group; and
   determine that the first differential trace pair signal transmission capabilities for the first differential trace pair have improved in response to the adjustment of the second differential trace pair equalization parameters for the second differential trace pair and the third differential trace pair equalization parameters for the at least one third differential trace pair and, in response, set the third differential trace pair equalization parameters for the at least one third differential trace pair.

3. The system of claim 1, wherein the at least one of the transmitter device and the receiver device is configured to:
   perform training operations on the plurality of differential trace pairs in the differential trace pair group, wherein the training operations provide for the identification of differential trace pair signal transmission capabilities for each of the plurality of differential trace pairs in the differential trace pair group; and identify the first differential trace pair based on the first differential trace pair signal transmission capabilities for the first differential trace pair being lower than the differential trace pair signal transmission capabilities of each of the other differential trace pairs in the differential trace pair group.

4. The system of claim 3, wherein the determining that the first differential trace pair signal transmission capabilities for the first differential trace pair have improved include determining that the first differential trace pair signal transmission capabilities for the first differential trace pair have increased in response to the adjustment of the second differential trace pair equalization parameters for the second differential trace pair.

5. The system of claim 1, wherein the adjusting the second differential trace pair equalization parameters for the second differential trace pair includes at least one of:

providing for the de-emphasis of signals transmitted by the second differential trace pair; and providing for the emphasis of signals transmitted by the second differential trace pair.

6. The system of claim 1, wherein the determining that first differential trace pair signal transmission capabilities for the first differential trace pair have improved include:

determining that an eye opening in an eye opening diagram for the differential trace pair group has increased in response to the adjustment of the second differential trace pair equalization parameters for the second differential trace pair and, in response, set the second differential trace pair equalization parameters for the second differential trace pair.

7. An Information Handling System (IHS), comprising:
a processing system; and
a memory system that is coupled to the processing system and that includes instructions that, when executed by the processing system, cause the processing system to provide an equalization engine that is configured to:

identify a first differential pair that is included in a plurality of differential pairs that are coupled to the processing system;

provide for the adjustment of second differential pair equalization parameters for a second differential pair that is included in the plurality of differential pairs that are coupled to the processing system; and determine that first differential pair signal transmission capabilities for the first differential pair have improved in response to the adjustment of the second differential pair equalization parameters for the second differential pair and, in response, cause the second differential pair equalization parameters to be set for the second differential pair.

8. The IHS of claim 7, wherein the equalization engine is configured to:

provide for the adjustment of third differential pair equalization parameters for at least one third differential pair that is included in the plurality of differential pairs that are coupled to the processing system; and determine that the first differential trace pair signal transmission capabilities for the first differential pair have improved in response to the adjustment of the second differential pair equalization parameters for the second differential pair and the third differential pair equalization parameters for the at least one third differential pair and, in response, cause the third differential pair equalization parameters to be set for the at least one third differential pair.

9. The IHS of claim 7, wherein the equalization engine is configured to:

perform training operations on the plurality of differential pairs that are coupled to the processing system, wherein the training operations provide for the identification of differential pair signal transmission capabilities for each of the plurality of differential pairs that are coupled to the processing system; and identify the first differential pair based on the first differential pair signal transmission capabilities for the first differential pair being lower than the differential pair signal transmission capabilities of each of the other differential pairs that are coupled to the processing system.

10. The IHS of claim 9, wherein the determining that the first differential pair signal transmission capabilities for the first differential pair have improved include determining that the first differential pair signal transmission capabilities for the first differential pair have increased in response to the adjustment of the second differential pair equalization parameters for the second differential pair.

11. The IHS of claim 7, wherein the adjusting the second differential pair equalization parameters for the second differential pair includes at least one of:

providing for the de-emphasis of signals transmitted by the second differential pair; and providing for the emphasis of signals transmitted by the second differential pair.

12. The IHS of claim 7, wherein the determining that first differential pair signal transmission capabilities for the first differential pair have improved include:

determining that an eye opening in an eye opening diagram for the plurality of differential pairs has increased in response to the adjustment of the second differential pair equalization parameters for the second differential pair and, in response, cause the second differential pair equalization parameters to be set for the second differential pair.

13. The IHS of claim 7, wherein the equalization engine is configured to:

identify the second differential pair for adjustment of its second differential pair equalization parameters based on:

a proximity of the second differential trace pair to the first differential trace pair; and an ability to reduce crosstalk with the first differential trace pair in response to the adjustment of the second differential pair equalization parameters.

14. A method for differential pair group equalization, comprising:

identifying, by at least one device coupled to a differential pair group, a first differential pair that is included in a plurality of differential pairs in the differential pair group;

providing, by the at least one device, for the adjustment of second differential pair equalization parameters for a second differential pair that is included in the plurality of differential pairs in the differential pair group; and determining, by the at least one device, that first differential pair signal transmission capabilities for the first differential pair have improved in response to the adjustment of the second differential pair equalization parameters for the second differential pair and, in response, causing the second differential pair equalization parameters to be set for the second differential pair.

15. The method of claim 14, further comprising:
providing, by the at least one device, for the adjustment of third differential pair equalization parameters for at least one third differential pair that is included in the plurality of differential pairs in the differential pair group; and
determining, by the at least one device, that the first differential trace pair signal transmission capabilities for the first differential pair have improved in response to the adjustment of the second differential pair equalization parameters for the second differential pair and the third differential pair equalization parameters for the at least one third differential pair and, in response, causing the third differential pair equalization parameters to be set for the at least one third differential pair.

16. The method of claim 14, further comprising:
performing, by the at least one device, training operations on the plurality of differential pairs in the differential pair group, wherein the training operations provide for the identification of differential pair signal transmission capabilities for each of the plurality of differential pairs in the differential pair group; and
identifying, by the at least one device, the first differential pair based on the first differential pair signal transmission capabilities for the first differential pair being lower than the differential pair signal transmission capabilities of each of the other differential pairs in the differential pair group.

17. The method of claim 16, wherein the determining that the first differential pair signal transmission capabilities for the first differential pair have improved include determining that the first differential pair signal transmission capabilities for the first differential pair have increased in response to the adjustment of the second differential pair equalization parameters for the second differential pair.

18. The method of claim 14, wherein the adjusting the second differential pair equalization parameters for the second differential pair includes at least one of:
providing for the de-emphasis of signals transmitted by the second differential pair; and
providing for the emphasis of signals transmitted by the second differential pair.

19. The method of claim 14, wherein the determining that first differential pair signal transmission capabilities for the first differential pair have improved include:
determining that an eye opening in an eye opening diagram for the plurality of differential pairs in the differential pair group has increased in response to the adjustment of the second differential pair equalization parameters for the second differential pair and, in response, cause the second differential pair equalization parameters to be set for the second differential pair.

20. The method of claim 14, further comprising:
identifying, by the at least one device, the second differential pair for adjustment of its second differential pair equalization parameters based on:
a proximity of the second differential trace pair to the first differential trace pair; and
an ability to reduce crosstalk with the first differential trace pair in response to the adjustment of the second differential pair equalization parameters.

* * * * *